(12) United States Patent
Lin (10) Patent No.: US 12,328,833 B2
(45) Date of Patent: Jun. 10, 2025

(54) ELECTRONIC DEVICE

(71) Applicant: LEOTEK CORPORATION, Taipei (TW)

(72) Inventor: Huang-Tso Lin, Taipei (TW)

(73) Assignee: LEOTEK CORPORATION, Taipei (TW)

( * ) Notice: Subject to any disclaimer, the term of this patent is extended or adjusted under 35 U.S.C. 154(b) by 258 days.

(21) Appl. No.: 18/326,007

(22) Filed: May 31, 2023

(65) Prior Publication Data

US 2024/0341048 A1 Oct. 10, 2024

(30) Foreign Application Priority Data

Apr. 10, 2023 (TW) .................................. 112113339

(51) Int. Cl.
| | |
|---|---|
| *G06F 1/16* | (2006.01) |
| *H05K 5/00* | (2025.01) |
| *H05K 5/02* | (2006.01) |
| *H05K 5/04* | (2006.01) |
| *H05K 5/06* | (2006.01) |
| *H05K 7/00* | (2006.01) |
| *H05K 7/14* | (2006.01) |

(52) U.S. Cl.
CPC ............. *H05K 5/04* (2013.01); *H05K 5/0204* (2013.01); *H05K 5/0213* (2013.01); *H05K 5/0247* (2013.01); *H05K 5/06* (2013.01); *H05K 7/1418* (2013.01)

(58) Field of Classification Search
CPC ...... H05K 5/04; H05K 5/0204; H05K 5/0213; H05K 5/0247; H05K 5/06; H05K 7/1418; H05K 7/1417; H05K 7/1425
See application file for complete search history.

(56) References Cited

U.S. PATENT DOCUMENTS

| | | | |
|---|---|---|---|
| 9,915,983 B2 * | 3/2018 | Yu .............................. | G06F 1/187 |
| 11,039,548 B1 * | 6/2021 | Chien ................. | H05K 7/20145 |
| 11,537,181 B1 * | 12/2022 | Wang ....................... | G06F 1/186 |
| 2004/0100765 A1 * | 5/2004 | Crippen .............. | H05K 7/20718 |
| | | | 361/679.48 |
| 2008/0117589 A1 * | 5/2008 | Carrera ...................... | G06F 1/20 |
| | | | 165/59 |
| 2009/0052143 A1 * | 2/2009 | Chiu ....................... | H04Q 1/114 |
| | | | 428/316.6 |
| 2010/0157521 A1 * | 6/2010 | Liu ............................. | G06F 1/20 |
| | | | 361/679.46 |

(Continued)

*Primary Examiner* — Anthony M Haughton
(74) *Attorney, Agent, or Firm* — JCIPRNET (57) ABSTRACT

An electronic device includes a housing, a dual-metal assembly, and a baffle. The housing has a through hole. The baffle is movably disposed in the housing. The baffle has at least one opening. The dual-metal assembly is connected to a side of the baffle and includes a first metal and a second metal. A thermal expansion coefficient of the first metal is different from a thermal expansion coefficient of the second metal, so that the dual-metal assembly is adapted to change between an initial state and a deforming state. When the dual-metal assembly is in the initial state, the opening is distant from the through hole. When the dual-metal assembly is in the deforming state, the dual-metal assembly drives the baffle to move, so that at least a portion of the opening is communicable with the through hole.

10 Claims, 8 Drawing Sheets

(56) References Cited

U.S. PATENT DOCUMENTS

| | | | |
|---|---|---|---|
| 2011/0053485 A1* | 3/2011 | Huang | H05K 7/20736 |
| | | | 454/184 |
| 2014/0204545 A1* | 7/2014 | Yu | G06F 1/186 |
| | | | 361/759 |
| 2024/0039196 A1* | 2/2024 | Tsai | H01R 13/6275 |

* cited by examiner

ELECTRONIC DEVICE

CROSS-REFERENCE TO RELATED APPLICATION

This application claims the priority benefit of Taiwan application serial no. 112113339, filed on Apr. 10, 2023. The entirety of the above-mentioned patent application is hereby incorporated by reference herein and made a part of this specification.

BACKGROUND

Technical Field

The invention relates to an electronic device, and in particular relates to an electronic device capable of dissipating heat.

Description of Related Art

In electronic devices, such as street lamps, after they are turned on, the internal temperature gradually increases with the heat generated by the operation of the electronic devices. Since the interior of an electronic device is usually a closed space (to prevent foreign matter from entering), hot air is not easy to discharge, resulting in poor heat dissipation of the electronic device. The internal components are susceptible to damage or reduced service life due to excessive heat. If a heat dissipating mechanism is added to the electronic device, it not only increases the material cost, but also increases the overall weight of the device. Therefore, developing an efficient and low-cost heat dissipation solution is one of the important issues in current electronic device design.

SUMMARY

An electronic device is provided in this invention, in which the electronic device may achieve good heat dissipation effect.

An electronic device of the invention includes a housing, a dual-metal assembly, and a baffle. The housing has a through hole. The baffle is movably disposed in the housing. The baffle has at least one opening. The dual-metal assembly is connected to a side of the baffle and includes a first metal and a second metal. A thermal expansion coefficient of the first metal is different from a thermal expansion coefficient of the second metal, so that the dual-metal assembly is adapted to change between an initial state and a deforming state. When the dual-metal assembly is in the initial state, the opening is distant from the through hole. When the dual-metal assembly is in the deforming state, the dual-metal assembly drives the baffle to move, so that at least a portion of the opening is communicable with the through hole.

In an embodiment of the invention, the dual-metal assembly has a first end and a second end opposite to each other. The first end is fixed to the housing, and the second end is connected to the baffle.

In an embodiment of the invention, the electronic device further includes a connecting member, and the second end is pivotally connected to the baffle through the connecting member.

In an embodiment of the invention, the electronic device further includes a limiting structure. The housing includes a side wall, the through hole is located on the side wall, and the limiting structure is fixed on the housing and adjacent to the side wall. The baffle is movably disposed between the limiting structure and the side wall.

In an embodiment of the invention, the electronic device further includes a guiding structure. The guiding structure includes a guiding groove and a guiding member, one of the housing and the baffle is provided with the guiding groove, other one of the housing and the baffle is provided with the guiding member, and one of the guiding member and the guiding groove moves along other one of the guiding member and the guiding groove.

In an embodiment of the invention, the guiding member and the guiding groove are a guiding column and a guiding slot, or a sliding member and a slide rail.

In an embodiment of the invention, the electronic device further includes an elastic member abutting against another side of the baffle.

In an embodiment of the invention, the electronic device further includes a waterproof structure. The waterproof structure is disposed on an inner surface of the housing or an outer surface of the baffle.

In an embodiment of the invention, the waterproof structure includes a first engaging portion and a second engaging portion corresponding to the first engaging portion. The inner surface of the housing is provided with the first engaging portion, and the outer surface of the baffle is provided with the second engaging portion.

In an embodiment of the invention, an area of the through hole is greater than an area of the opening.

Based on the above, the dual-metal assembly of the electronic device of the invention is connected to one side of the baffle. When the dual-metal assembly is in the initial state, the opening of the baffle is distant from the through hole of the housing, so as to prevent foreign matter from entering the housing. When the dual-metal assembly is in a deforming state, since the thermal expansion coefficient of the first metal is different from the thermal expansion coefficient of the second metal, the dual-metal assembly deforms and drives the baffle to move, so that at least a portion of the opening is communicable with the through hole. In this way, the hot air inside the housing may be discharged out of the housing through the opening and the through hole, thereby achieving efficient heat dissipation effect. At the same time, the heat dissipation design has a light structure, which is beneficial to reduce the overall weight of the electronic device, thereby saving production costs. In addition, the heat dissipation design does not need to be driven by electricity, and has high reliability and long service life.

DETAILED DESCRIPTION OF DISCLOSED EMBODIMENTS

Figure 1:
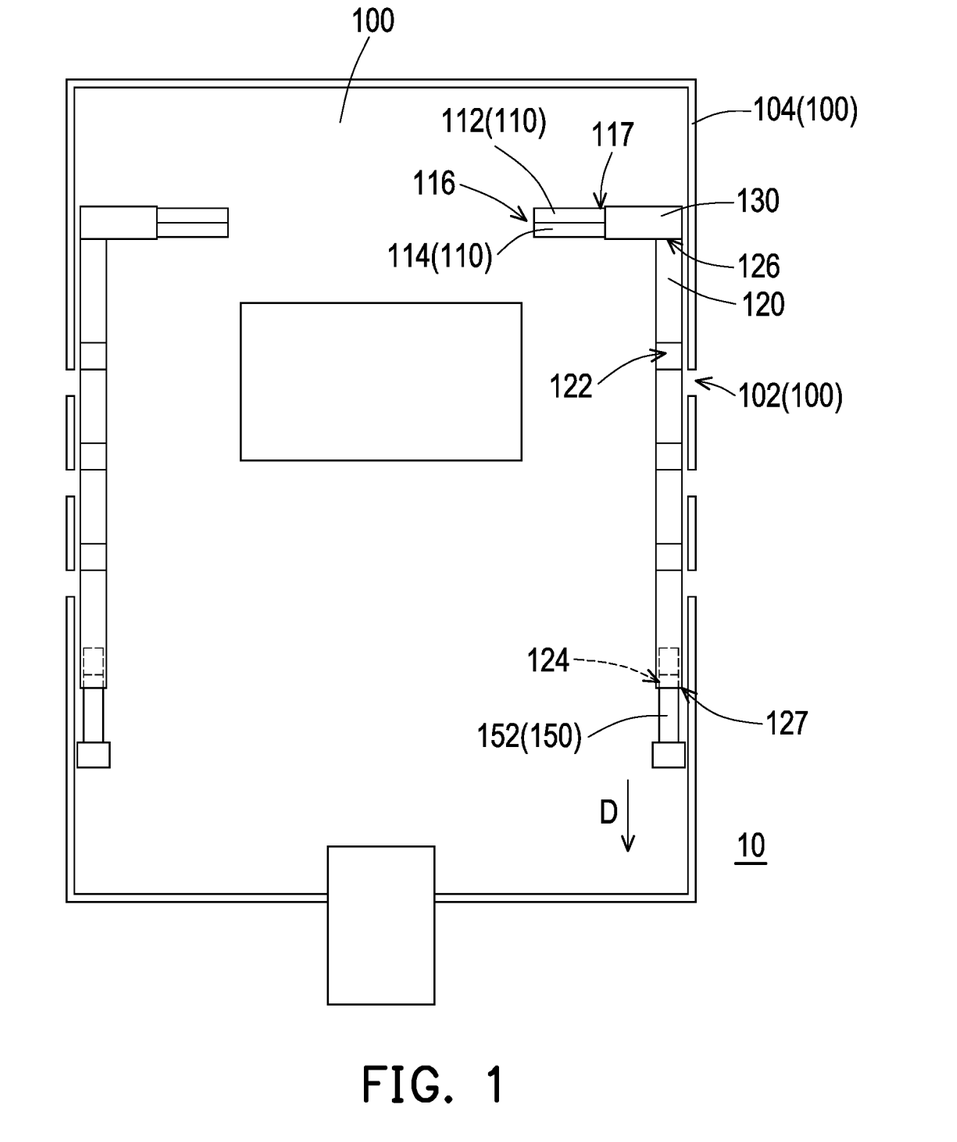
FIG. 1 is a schematic diagram of an electronic device according to an embodiment of the invention.
Figure 2:
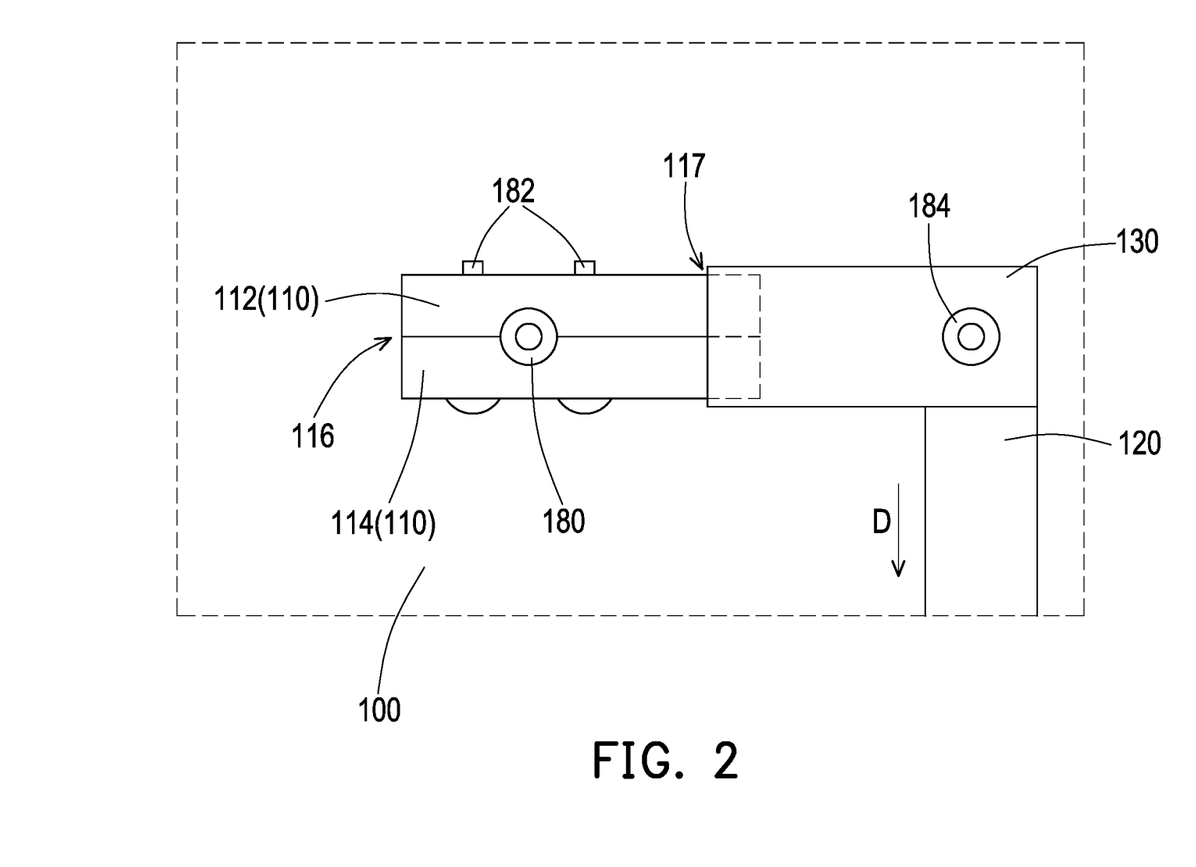
FIG. 2 is a partial enlarged schematic diagram of the electronic device of FIG. 1.

FIG. 1 is a schematic diagram of an electronic device according to an embodiment of the invention. FIG. 2 is a partial enlarged schematic diagram of the electronic device of FIG. 1. In order to clearly show the through hole of the housing, the waterproof structure in FIG. 1 is hidden. In addition, in FIG. 1 the guiding groove and the portion of the guiding member extending into the guiding groove are shown by dashed lines, and in FIG. 2 the portions of the first metal and the second metal extending into the connecting member are shown by dashed lines. Referring to FIG. 1 and FIG. 2, in this embodiment, the electronic device 10 is, for example, a street lamp, but the type of the electronic device 10 is not limited thereto.

The electronic device 10 includes a housing 100, a dual-metal assembly 110, and a baffle 120. The housing 100 includes a side wall 104 and has at least one through hole 102. The through holes 102 are located on the side wall 104 and are configured to discharge the air in the housing 100 whose temperature is raised due to the heat generated by operation of the electronic device 10. However, the number of the through holes 102 is not limited thereto and may be adjusted according to actual requirements.

The dual-metal assembly 110 includes a first metal 112 and a second metal 114 disposed in the housing 100 and connected to one side (the first end portion 126) of the baffle 120. The first metal 112 and the second metal 114 are connected and arranged side by side along a moving direction D, in which the moving direction D is parallel to the side wall 104.

As shown in FIG. 2, the dual-metal assembly 110 has a first end 116 and a second end 117 opposite to each other. The electronic device 10 may include a fixing member 180 and a locking member 182. The fixing member 180 fixes the first end 116 of the dual-metal assembly 110 to the housing 100. The locking member 182 is disposed on the first end 116 so that the first metal 112 and the second metal 114 are firmly connected at the first end 116. In this embodiment, taking the first end 116 of the dual-metal assembly 110 being fixed by the fixing member 180 along the direction of entering and leaving the paper plane as an example, the fixing member 180 and the locking member 182 are, for example, screws. However, the invention does not limit the configuration of the fixing member 180 and the locking member 182.

In this embodiment, the thermal expansion coefficient of the first metal 112 is different from the thermal expansion coefficient of the second metal 114. The first metal 112 and the second metal 114 are preferably selected from steel plates (the thermal expansion coefficient is 12 ppm/° C.), aluminum plates (the thermal expansion coefficient is 23 ppm/° C.) and brass plates (the thermal expansion coefficient is 18.7 ppm/° C.), but the material of the first metal 112 and the material of the second metal 114 are not limited thereto.

The baffle 120 is located beside the through hole 102 (FIG. 1) and linked to the dual-metal assembly 110, and is movably disposed in the housing 100. In detail, the electronic device 10 of this embodiment further includes a connecting member 130 connected to the second end 117 of the dual-metal assembly 110. The connecting member 130 is a material that is not easily deformed by heat, such as a heat-resistant plastic member. The connecting member 130 is pivotally connected to the baffle 120 through a pivoting member 184, so that the dual-metal assembly 110 and the connecting member 130 are linked with the baffle 120.

In addition, as shown in FIG. 1, the baffle 120 has at least one opening 122, and the number of the openings 122 may correspond to the number of the through holes 102. When the opening 122 and the through hole 102 are located at corresponding positions, the heat generated in the housing 100 due to the operation of the electronic device 10 may be discharged through the opening 122 and the through hole 102.

The electronic device 10 of the invention achieves efficient heat dissipation through the cooperation of the housing 100, the dual-metal assembly 110, and the baffle 120. The heat dissipation means of the electronic device 10 is fully described below.

Figure 3A:
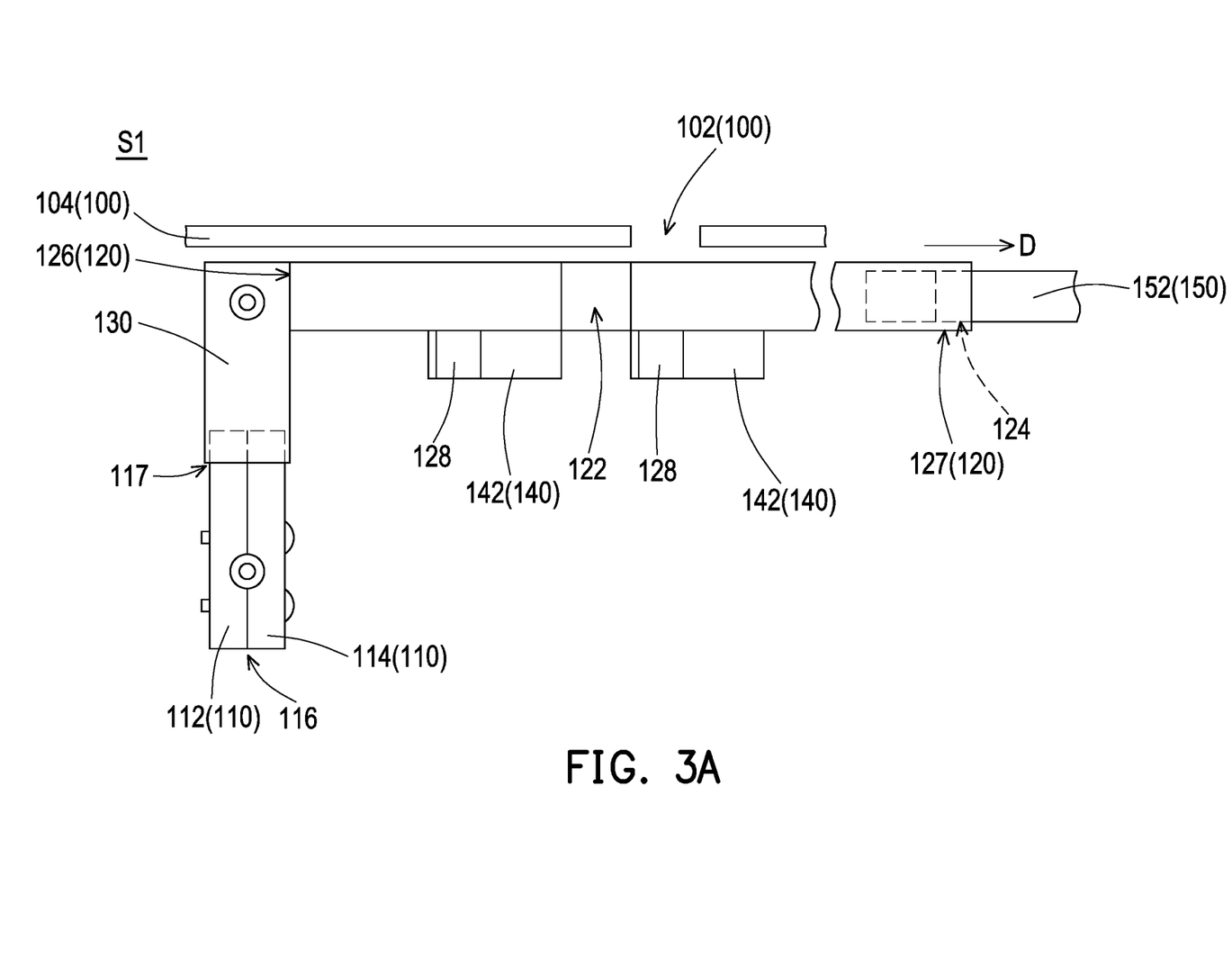
FIG. 3A is a partial schematic diagram of the electronic device of FIG. 1 in an initial state.
Figure 3B:
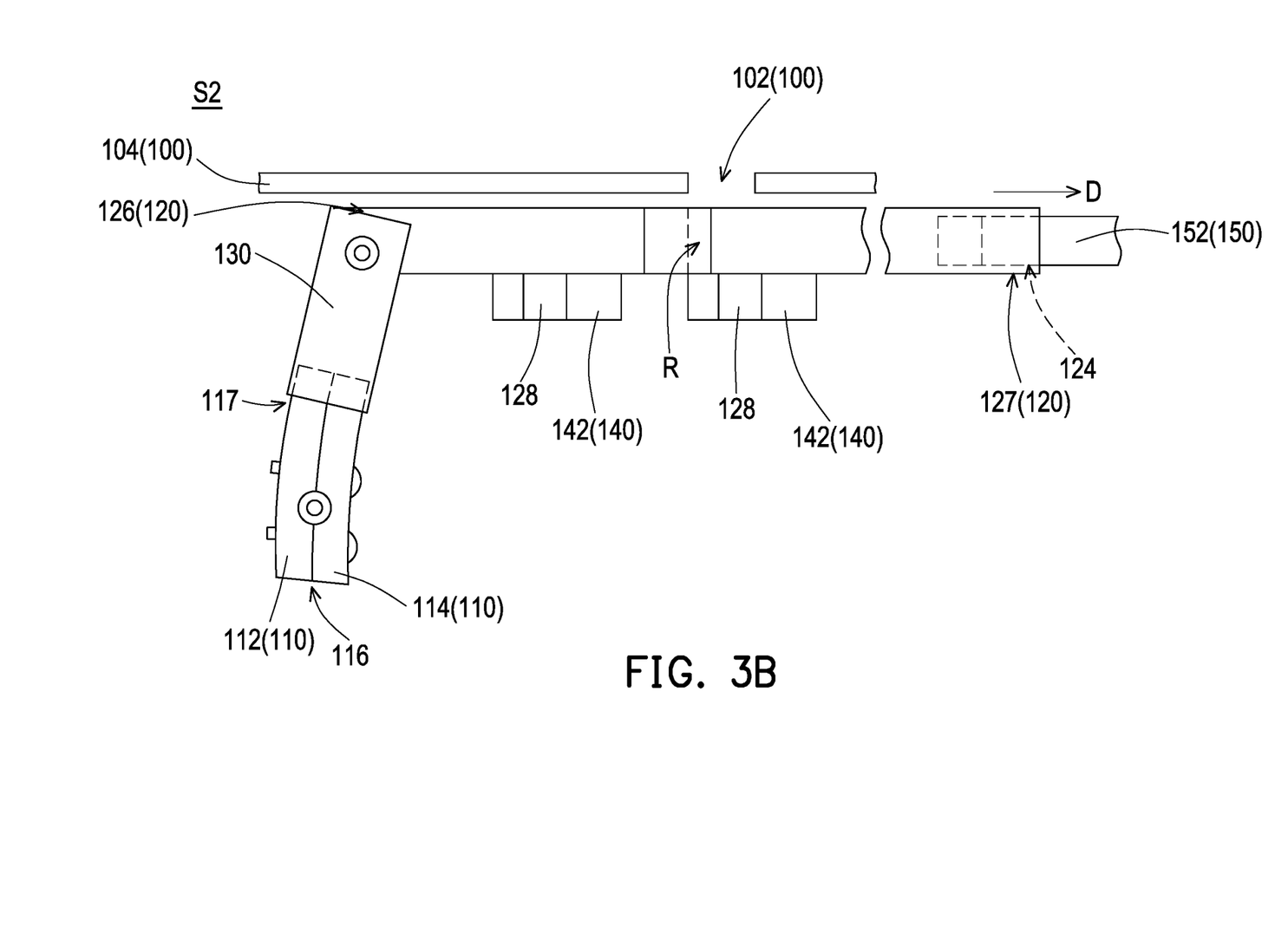
FIG. 3B is a partial schematic diagram of the electronic device in FIG. 3A in a deforming state.
Figure 3C:
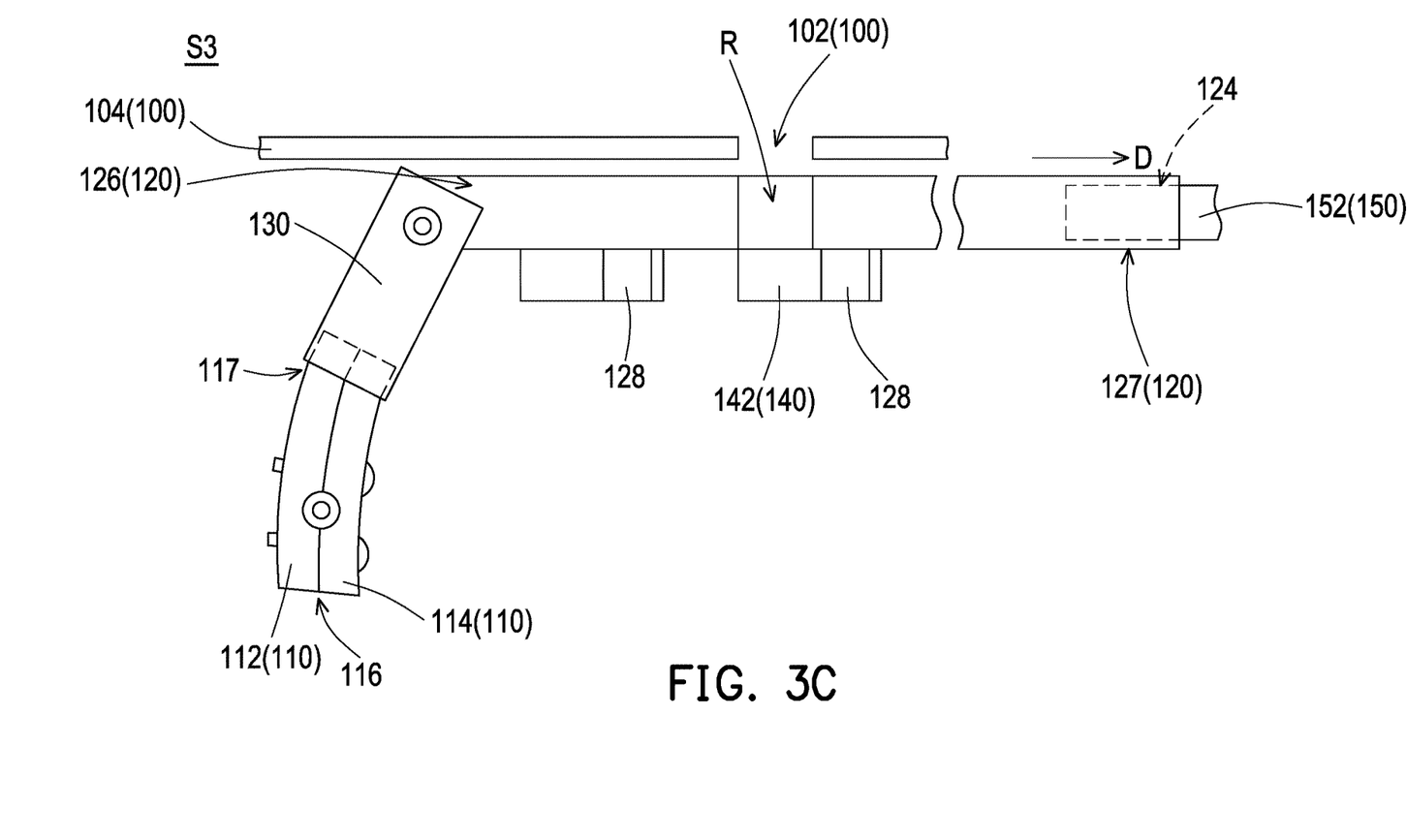
FIG. 3C is a partial schematic diagram of the electronic device in FIG. 3A in another deforming state.

FIG. 3A is a partial schematic diagram of the electronic device of FIG. 1 in an initial state. FIG. 3B is a partial schematic diagram of the electronic device in FIG. 3A in a deforming state. FIG. 3C is a partial schematic diagram of the electronic device in FIG. 3A in another deforming state. In order to clearly show the positional relationship between the through hole and the opening, the waterproof structure and the second engaging portion in FIG. 3A to FIG. 3C are hidden. In addition, the guiding groove and the portion of the guiding member extending into the guiding groove in FIG. 3A to FIG. 3C are shown by dashed lines, and in FIG. 3B, the imaginary boundaries where the openings are aligned with the edges of the through holes are shown by dashed lines.

Referring to FIG. 3A to FIG. 3C, in this embodiment, the first metal 112 is a metal with a higher thermal expansion coefficient, and the second metal 114 is a metal with a lower thermal expansion coefficient. When the electronic device 10 operates for a period of time and the temperature inside the housing 100 gradually increases, since the thermal expansion coefficient of the first metal 112 is higher than the thermal expansion coefficient of the second metal 114, the expansion degree of the first metal 112 is greater than the expansion degree of the second metal 114. Therefore, the dual-metal assembly 110 bends toward the second metal 114, thereby driving the baffle 120 to move.

Specifically, as shown in FIG. 3A, when the dual-metal assembly 110 is at a first temperature T1, the dual-metal assembly 110 is in an initial state S1 (undeformed). At this time, the opening 122 of the baffle 120 is distant from the through hole 102 of the housing 100, and the baffle 120 blocks the through hole 102 to prevent foreign matter from entering the housing 100.

Next, as shown in FIG. 3B, when the dual-metal assembly 110 rises to a second temperature T2 (the second temperature T2 is greater than the first temperature T1), the dual-metal assembly 110 is in a deforming state S2, that is, the dual-metal assembly 110 is bent and deformed due to the difference in thermal expansion coefficient between the first metal 112 and the second metal 114. Since the first end 116 (FIG. 2) of the dual-metal assembly 110 is fixed to the housing 100, and the second end 117 is connected to the baffle 120 through the connecting member 130, the dual-metal assembly 110 may bend and deform with the first end 116 operating as the fulcrum, driving the connecting member 130 to shift, and further driving the baffle 120 pivotally connected to the connecting member 130 to move.

It should be noted that the electronic device 10 may further optionally include a limiting structure 140 and a guiding structure 150 for guiding the baffle 120 to move along the moving direction D. The limiting structure 140 is adjacent to the side wall 104 and fixed to the housing 100, so that the baffle 120 is movably disposed between the limiting structure 140 and the side wall 104.

In detail, the limiting structure 140 includes a protruding portion 142 to prevent the baffle 120 from moving beyond the protruding portion 142. Alternatively, the limiting structure 140 may include a protruding portion 142 and a combining portion 128 substantially matched in shape with the protruding portion 142. In this embodiment, the protruding portion 142 is a conduit, and the combining portion 128 is a casing ring or an arc-shaped sleeve at least partially matching the shape of the conduit. The combining portion 128 is disposed on the baffle 120 and sleeved on the protruding portion 142, when the baffle 120 is pushed by the dual-metal assembly 110 or the connecting member 130, the protruding portion 142 and the combining portion 128 causes the baffle 120 to move smoothly along the moving direction D. It should be noted that the limiting structure 140 of this embodiment guides the moving direction of the baffle 120 through the protruding portion 142, but the configuration of which the limiting structure 140 guides the baffle 120 is not limited thereto.

On the other hand, the baffle 120 has a first end portion 126 and a second end portion 127 opposite to each other, the first end portion 126 is close to the connecting member 130, and the second end portion 127 is close to the guiding structure 150. The guiding structure 150 includes a guiding groove 124 and a guiding member 152, one of the housing 100 and the baffle 120 is provided with the guiding groove 124, the other one of the housing 100 and the baffle 120 is provided with the guiding member 152, and one of the guiding member 152 and the guiding groove 124 moves along the other one of the guiding member 152 and the guiding groove 124. In this embodiment, the guiding groove 124 is a slot and is disposed on the second end portion 127 of the baffle 120 along the moving direction D. The guiding member 152 is a guiding column, which is disposed on the housing 100, extending along the moving direction D and into the guiding groove 124 to ensure that the baffle 120 moves along the moving direction D. In other embodiments, the guiding groove 124 and the guiding member 152 may also be a sliding member and a slide rail; however, the type of the guiding structure 150 is not limited thereto.

As shown in FIG. 3B, under the guidance of the limiting structure 140 and the guiding structure 150, the baffle 120 may move along the moving direction D, so that at least a portion of the opening 122 (i.e., the communication region R) is communicable with the through hole 102. Therefore, the hot air in the housing 100 is discharged through the opening 122 and the through hole 102 to reduce the internal temperature of the housing 100 and prevent the elements in the electronic device 10 from being damaged or shortened in service life due to overheating.

In other embodiments, the limiting structure 140 and the guiding structure 150 may be disposed alternatively, or may be disposed in other forms.

As shown in FIG. 3C, furthermore, if the dual-metal assembly 110 is at a third temperature T3 (the third temperature T3 is greater than the second temperature T2), the dual-metal assembly 110 is in another deforming state S3.

At this time, the temperature of the dual-metal assembly 110 is higher, and the difference in expansion degree between the first metal 112 and the second metal 114 is greater, so that the bending degree of the dual-metal assembly 110 in the deforming state S3 is greater than the bending degree of the dual-metal assembly 110 in the deforming state S2. Therefore, the displacement of the baffle 120 in the moving direction D is larger, the area of the communication region R where the opening 122 is communicable with the through hole 102 is enlarged, which facilitates and accelerates discharging of hot air in the housing 100.

In other words, the electronic device 10 of the invention utilizes the difference in thermal expansion coefficient between the first metal 112 and the second metal 114, so that the dual-metal assembly 110 is adapted to change between the initial state S1 and the deforming states S2 and S3. Therefore, when the temperature inside the housing 100 changes, the amount of heat discharged may be adjusted correspondingly, for example, when the temperature inside the housing 100 is high, the amount of heat discharged from the electronic device 10 may be correspondingly increased to enhance the heat dissipation capability.

In addition, the maximum working temperature of the preferred metal in this embodiment is about 250° C., while the maximum internal temperature of a general lamp is about 90° C. Therefore, if this design is applied to a lamp, the heat dissipation performance is not only reliable but also stable.

In addition, when the dual-metal assembly 110 is deformed, the displacement along the moving direction D of one end of the connecting member 130 close to the first end portion 126 is greater than the displacement along the moving direction D of the second end 117 of the dual-metal assembly 110. That is, connecting the dual-metal assembly 110 and the baffle 120 through the connecting member 130 amplifies the bending effect of the dual-metal assembly 110, and the displacement of the baffle 120 can be increased.

The electronic device 10 of this embodiment realizes heat dissipation through the dual-metal assembly 110 and the baffle 120, and has a simple and light structure, which is beneficial in reducing the overall weight of the electronic device 10 and saving production costs. Moreover, this heat dissipation design does not need to be driven by electricity, and has high reliability and long service life.

In addition, in other embodiments, the area of the through hole 102 may be greater than the area of the opening 122, so that one through hole 102 may correspond to multiple openings 122 at the same time.

Figure 4A:
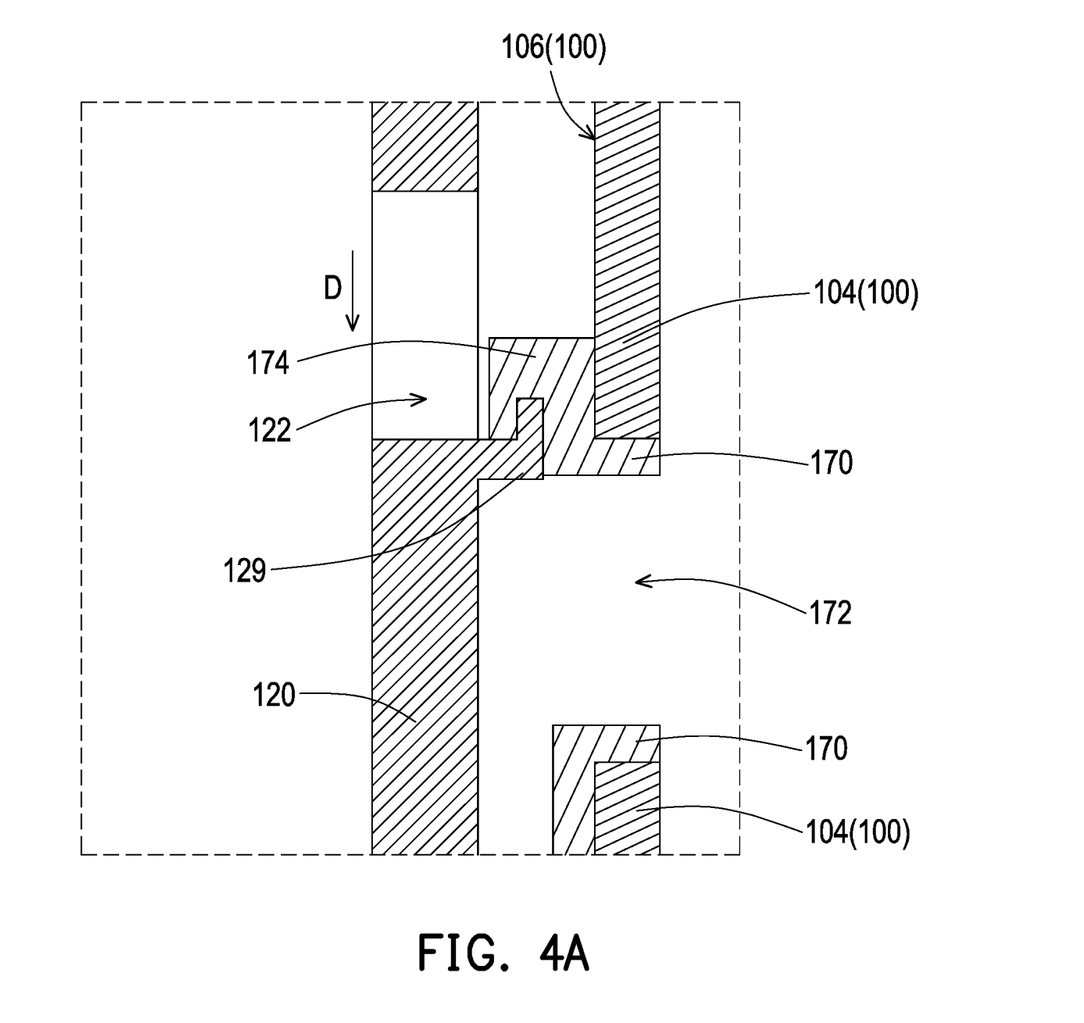
FIG. 4A is a partial cross-sectional schematic diagram of the electronic device of FIG. 1.
Figure 4B:
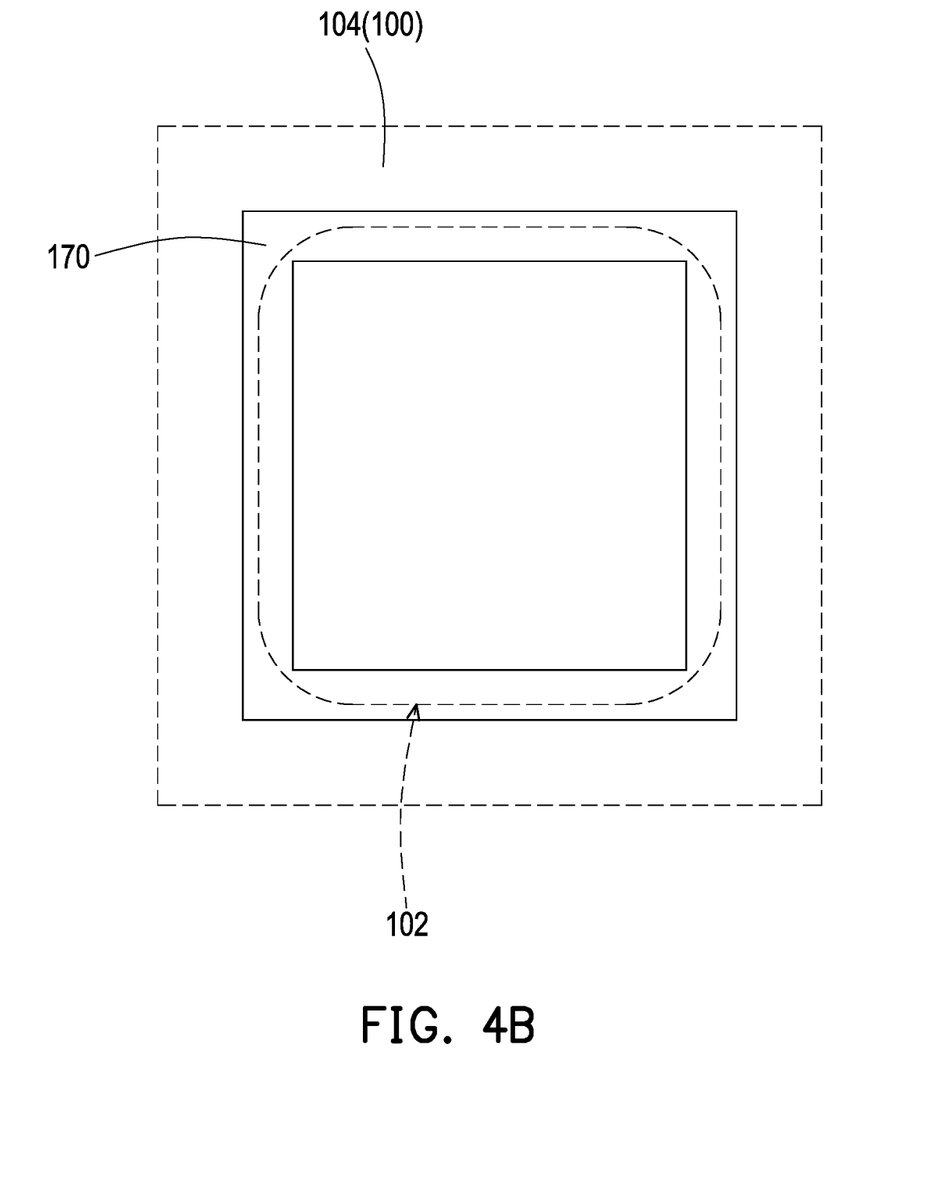
FIG. 4B is a front-view schematic diagram of the housing and the waterproof structure of FIG. 4A.

FIG. 4A is a partial cross-sectional schematic diagram of the electronic device of FIG. 1. FIG. 4B is a front-view schematic diagram of the housing and the waterproof structure of FIG. 4A. Referring to FIG. 4A and FIG. 4B, in this embodiment, the electronic device 10 further includes a waterproof structure 170. The waterproof structure 170 is, for example, a heat-resistant plastic film, but the material of the waterproof structure 170 is not limited thereto.

The side wall 104 of the housing 100 includes an inner surface 106 facing the baffle 120. The waterproof structure 170 is disposed on the inner surface 106 of the housing 100 or the outer surface of the baffle 120, that is, the waterproof structure 170 is disposed around the through hole 102 (FIG. 4A and FIG. 4B) or the opening 122, so as to prevent external moisture from entering the housing 100 from the gap between the housing 100 and the opening 122 of the baffle 120. Preferably, the waterproof structure 170 may extend to the inner side of the through hole 102 (as shown in FIG. 4A), so as to achieve a better waterproof effect.

The electronic device 10 of this embodiment further includes a first engaging portion 174 and a second engaging portion 129 corresponding to the first engaging portion 174. The inner surface 106 of the housing 100 is provided with the first engaging portion 174, and the outer surface of the baffle 120 is provided with the second engaging portion 129. When the dual-metal assembly 110 is in the initial state S1 and the baffle 120 blocks the through hole 102, the first engaging portion 174 is engaged with the second engaging portion 129. When the dual-metal assembly 110 is in the deforming state S2 (or S3) and drives the baffle 120 to move along the moving direction D, the first engaging portion 174 is separated from the second engaging portion 129. Thereby, when the dual-metal assembly 110 recovers from the deforming state S2 (or S3), the baffle 120 may also return to its original position. In this embodiment, the first engaging portion 174 is combined with the waterproof structure 170, but the invention is not limited thereto. The first engaging portion 174 may also be an independent element disposed on the inner surface 106 of the housing 100 or an integrated element protruding from the inner surface 106 of the housing 100.

In addition, when the opening 122 of the baffle 120 is distant from the through hole 102, the waterproof structure 170 blocks the communication path between the opening 122 and the through hole 102, so as to prevent external moisture from entering the housing 100 from the opening 122.

Figure 5:
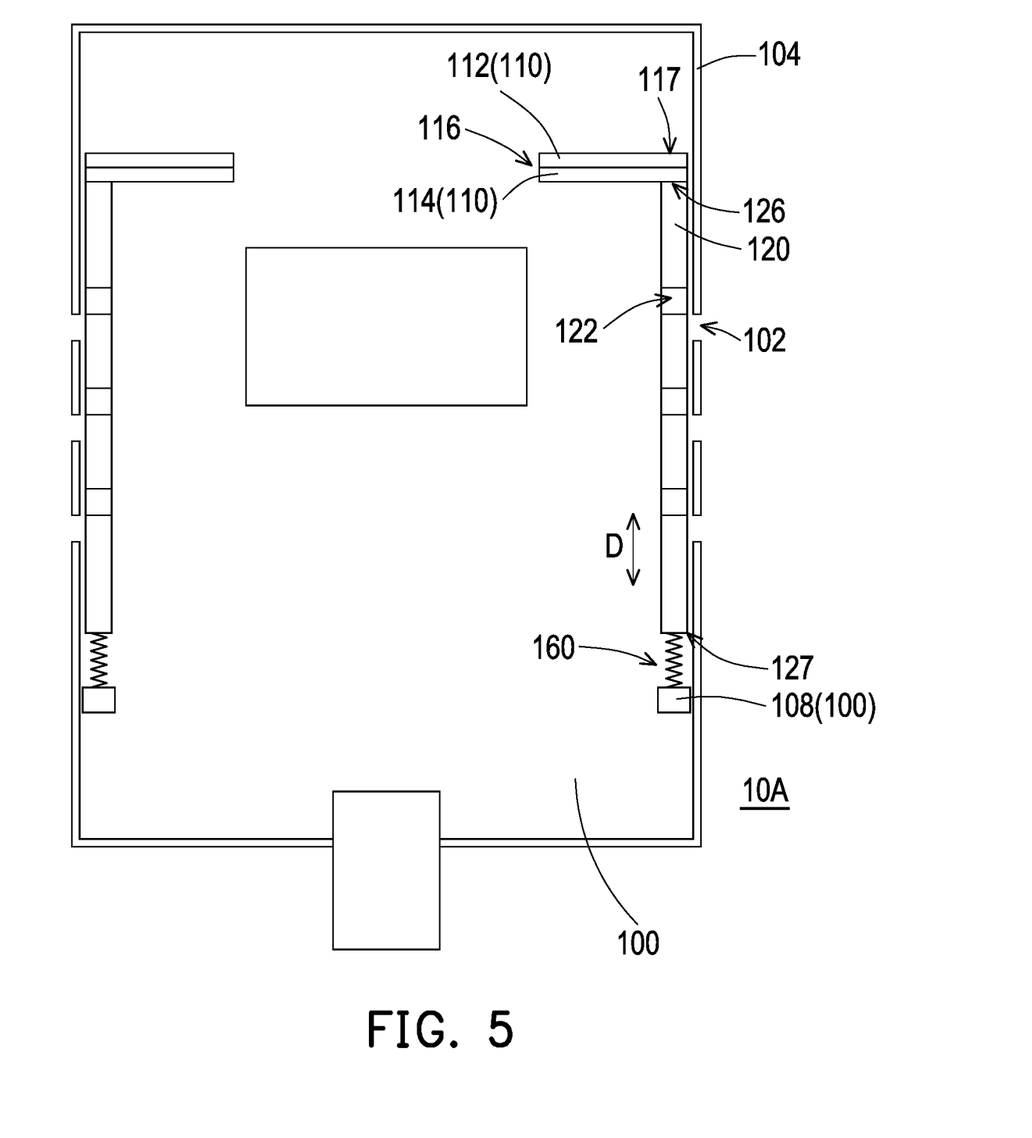
FIG. 5 is a schematic diagram of an electronic device according to another embodiment of the invention.

FIG. 5 is a schematic diagram of an electronic device according to another embodiment of the invention. In order to clearly show the through hole of the housing, the waterproof structure in FIG. 5 is hidden. The main difference between the electronic device 10A in FIG. 5 and the electronic device 10 in FIG. 1 is that the electronic device 10A may further include an elastic member 160, and the dual-metal assembly 110 may be directly connected to the baffle 120 without the connecting member 130.

Referring to FIG. 5, in this embodiment, there is no connecting member 130 (FIG. 1) between the dual-metal assembly 110 and the baffle 120, and the first end portion 126 of the baffle 120 is directly connected to the second end 117 of the dual-metal assembly 110. Therefore, the displacement generated by the second end 117 is the displacement of the baffle 120.

On the other hand, in this embodiment, the elastic member 160 abuts against the other side (the second end portion 127) of the baffle 120. Specifically, one end of the elastic member 160 is connected to a protrusion 108 of the housing 100, and the other end of the elastic member 160 abuts against the second end portion 127 of the baffle 120. The protrusion 108 may limit the moving range of the baffle 120 along the moving direction D. When the dual-metal assembly 110 recovers from the deforming state S2 or S3, the elastic member 160 pushes against or pulls the baffle 120 back along the moving direction D by the elastic force, so that the baffle 120 blocks the through hole 102. That is, the elastic member 160 facilitates returning/resetting the baffle 120.

To sum up, the dual-metal assembly of the electronic device of the invention is connected to one side of the baffle. When the dual-metal assembly is in the initial state, the opening of the baffle is distant from the through hole of the housing, and the baffle blocks the through hole. When the dual-metal assembly is in a deforming state, since the thermal expansion coefficient of the first metal is different from the thermal expansion coefficient of the second metal, the dual-metal assembly deforms and drives the baffle to move, so that at least a portion of the opening is communicable with the through hole. In this way, the hot air inside the housing may be discharged out of the housing through the opening and the through hole, thereby achieving efficient heat dissipation. At the same time, the heat dissipation design has a light structure, which is beneficial to reduce the overall weight of the electronic device, thereby saving production costs. In addition, the heat dissipation design does not need to be driven by electricity, and has high reliability and long service life.

Although the invention has been described in detail with reference to the above embodiments, the embodiments are not intended to limit the invention. Those skilled in the art should understand that it is possible to make changes, combinations, and modifications without departing from the spirit and scope of the invention. Therefore, the protection scope of the invention shall be defined by the following claims.

What is claimed is:

1. An electronic device, comprising:
   a housing, having a through hole;
   a baffle, movably disposed in the housing, the baffle having at least one opening; and
   a dual-metal assembly, connected to a side of the baffle, the dual-metal assembly comprising a first metal and a second metal, wherein a thermal expansion coefficient of the first metal is different from a thermal expansion coefficient of the second metal, so that the dual-metal assembly is adapted to change between an initial state and a deforming state,
   wherein, when the dual-metal assembly is in the initial state, the opening is distant from the through hole; when the dual-metal assembly is in the deforming state, the dual-metal assembly drives the baffle to move, so that at least a portion of the opening is communicable with the through hole.

2. The electronic device according to claim 1, wherein the dual-metal assembly has a first end and a second end opposite to each other, the first end is fixed to the housing, and the second end is connected to the baffle.

3. The electronic device according to claim 2, further comprising a connecting member, wherein the second end is pivotally connected to the baffle through the connecting member.

4. The electronic device according to claim 1, further comprising a limiting structure, wherein the housing comprises a side wall, the through hole is located on the side wall, the limiting structure is fixed on the housing and adjacent to the side wall, and the baffle is movably disposed between the limiting structure and the side wall.

5. The electronic device according to claim 1, further comprising a guiding structure, wherein the guiding structure comprises a guiding groove and a guiding member, one of the housing and the baffle is provided with the guiding groove, other one of the housing and the baffle is provided with the guiding member, and one of the guiding member and the guiding groove moves along other one of the guiding member and the guiding groove.

6. The electronic device according to claim 5, wherein the guiding member and the guiding groove are a guiding column and a guiding slot, or a sliding member and a slide rail.

7. The electronic device according to claim 1, further comprising an elastic member abutting against another side of the baffle.

8. The electronic device according to claim 1, further comprising a waterproof structure, disposed on an inner surface of the housing or an outer surface of the baffle.

9. The electronic device according to claim 1, further comprising a first engaging portion and a second engaging portion corresponding to the first engaging portion, wherein an inner surface of the housing is provided with the first engaging portion, and an outer surface of the baffle is provided with the second engaging portion.

10. The electronic device according to claim 1, wherein an area of the through hole is greater than an area of the opening.

* * * * *